United States Patent
Taniguchi et al.

(10) Patent No.: US 7,657,660 B2
(45) Date of Patent: Feb. 2, 2010

(54) INPUT-OUTPUT DEVICE AND CONTROL METHOD THEREOF

(75) Inventors: Kazuya Taniguchi, Kasugai (JP); Osamu Matsuura, Kasugai (JP); Kazuo Ohno, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 292 days.

(21) Appl. No.: 11/701,384

(22) Filed: Feb. 2, 2007

(65) Prior Publication Data
US 2007/0276964 A1 Nov. 29, 2007

(30) Foreign Application Priority Data
Mar. 29, 2006 (JP) ............................. 2006-091427

(51) Int. Cl.
*G06F 3/00* (2006.01)
(52) U.S. Cl. ............................... 710/2; 710/62; 326/26

(58) Field of Classification Search ................. None
See application file for complete search history.

(56) References Cited

U.S. PATENT DOCUMENTS
5,692,917 A * 12/1997 Rieb et al. .................. 439/225

FOREIGN PATENT DOCUMENTS
JP 61-156918 7/1986

* cited by examiner

*Primary Examiner*—Eron J Sorrell
(74) *Attorney, Agent, or Firm*—Fujitsu Patent Center

(57) ABSTRACT

The present invention provides an input/output device capable of bringing a per-unit input/output circuit into a simple configuration without impairing reliability even when logic levels opposite in polarity are outputted between input/output devices made conductive to the outside. The input/output device is equipped with one reference port Pk selected from a port group which inputs and outputs signals, target ports Pt selected from other than the reference port of the port group, and a conduction detector which detects that conduction is made between input/output terminals for the reference port Pk and the target ports Pt.

10 Claims, 11 Drawing Sheets

BLOCK DIAGRAM SHOWING CONFIGURATION OF INPUT/OUTPUT DEVICE ACCORDING TO FIRST EMBODIMENT

FIG.1 BLOCK DIAGRAM SHOWING CONFIGURATION OF INPUT/OUTPUT DEVICE ACCORDING TO FIRST EMBODIMENT

CIRCUIT DIAGRAM ILLUSTRATING SPECIFIC EXAMPLE OF CONDUCTION DETECTOR

STATE TRANSITION DIAGRAM DEPICTING OPERATION
OF CONDUCTION DETECTION STATE MACHINE

CIRCUIT DIAGRAM ILLUSTRATING SPECIFIC EXAMPLE OF DETECTION RESULT REGISTER

CIRCUIT DIAGRAM SHOWING SPECIFIC EXAMPLE ILLUSTRATIVE OF EACH OF FIRST CONTROL SIGNAL SELECTOR AND FIRST DATA SIGNAL SELECTOR

CIRCUIT DIAGRAM ILLUSTRATING SPECIFIC EXAMPLE OF SECOND CONTROL SIGNAL SELECTOR

CIRCUIT DIAGRAM DEPICTING SPECIFIC EXAMPLE OF SECOND DATA SIGNAL SELECTER

STATE TRANSITION DIAGRAM SHOWING OPERATION OF
CONDUCTION DETECTION PORT CONTROLLER

CIRCUIT DIAGRAM ILLUSTRATING CONFIGURATION OF INPUT/OUTPUT CIRCUIT OF INPUT/OUTPUT DEVICE ACCORDING TO SECOND EMBODIMENT

CIRCUIT DIAGRAM DEPICTING CONFIGURATION OF INPUT/OUTPUT DEVICE ACCORDING TO THIRD EMBODIMENT

CIRCUIT DIAGRAM OF SEMICONDUCTOR INTEGRATED
DEVICE ACCORDING TO RELATED ART

INPUT-OUTPUT DEVICE AND CONTROL METHOD THEREOF

CROSS-REFERENCE TO RELATED APPLICATIONS

This application is based upon and claims the benefit of priority from each of the prior Japanese Patent Application No. 2006-091427 filed on Mar. 29, 2006, the entire contents of which are incorporated herein by reference.

BACKGROUND OF THE INVENTION

1. Field of the Invention

The present invention relates to an input/output device which performs the input/output of internal and external signals to and from equipment, and particularly to input/output ports in a semiconductor device.

2. Description of Related Art

When equipment such as a motor requiring a large current is directly driven, a technique for driving a plurality of input/output ports by signals changed at the same logic level and making their input/output devices conductive to the outside with respect to each other to thereby take out a large current has been used in a semiconductor device. A problem arises in that when the setting of the input/output at the respective input/output devices is programmable and the plurality of input/output devices are made conductive to the outside, a large current flows between the input/output devices when levels of other polarity are outputted to the respective input/output devices due to programming glitches or the like, thereby causing the fear of occurrence of breakdowns in the input/output devices.

With a view toward solving such a problem, there has been invented a technique about a semiconductor integrated device, which has been disclosed in Japanese unexamined patent publication No. 1986(S61)-156918. The semiconductor integrated device of this disclosure shown in FIG. 11 has three CMOS inverters (105, 106), (108, 109) and (113, 114), two transfer gates 102 and 115, and two initial value setting circuits 104 and (116, 111). A positive voltage is applied to source terminals 101 and 112, and an input signal is applied to a signal input terminal 107. The transfer gates 102 and 105 are brought into conduction when their control input terminals are low and high levels, respectively, whereas when they are brought into non-conduction when the control input terminals are high and low levels, respectively.

Let's assume that when a signal output terminal 110 is of a high level, the signal output terminal 110 is short-circuited to a ground potential. In this case, the transistors 105 and 108 are both in an operating state. Thus, the input of the inputs of the NOR gate 104, which is supplied from the transistor 105, becomes low in level and its output is brought to a high level. Therefore, the transfer gate 102 is brought to a non-conducting state. Thus, a current path extending from the source terminal 101 to the transistor 108 via the transfer gate 102 and extending from the signal output terminal 110 to the ground potential is interrupted or cut off, thus suppressing the flow of a large current through the current path.

Let's assume that when the signal output terminal 110 is low in level, the signal output terminal 110 is short-circuited to the source potential. In this case, the transistors 109 and 114 are both in an operating state. Accordingly, since the inputs of the NAND gate 111 are both rendered high in level and its output is rendered low in level, the transfer gate 115 is placed in an interruption state. Thus, a current path extending from the signal output terminal 110 to the ground potential via the transistor 109 and the transfer gate 115 is interrupted to suppress the flow of a large current through the current path.

That is, the short-circuited state of the signal output terminal 110 is detected and hence the transfer gates 102 and 115 are cut off or interrupted in the semiconductor device. It is thus possible to suppress the flow of an excessive current through the CMOS inverters (108 and 109) and by extension prevent their breakages.

SUMMARY OF THE INVENTION

It is considered that the technique described in the disclosure is used in the respective input/output devices where the input/output devices are made conductive to the outside and thereby driven. Due to programming glitches or the like of the settings of the input/output devices, however, a short-circuit current flows through each of the input/output devices although it is instantaneous when logic levels of opposite polarity are outputted between the input/output devices made conductive to the outside, so that deterioration in reliability due to physical damage of the input/output devices occurs, thus causing a problem. Further, a problem arises in that since one input/output circuit needs three CMOS inverters, two transfer gates and two initial value setting circuits, an increase in circuit scale is incurred.

The present invention has been made in view of the problems of the background art. It is an object of the present invention to provide an input/output device capable of bringing a per-unit input/output circuit into a simple configuration without impairing reliability even when logic levels opposite in polarity are outputted between input/output devices made conductive to the outside.

To achieve the above object, there is provided an input/output device comprising: one reference port selected from a port group which inputs and outputs signals; a target port selected from other than the reference port of the port group; and a conduction detector which detects that conduction is made between input/output terminals for the reference port and the target port.

There is also provided a method of controlling an input/output device, comprising the steps of: selecting one reference port from a port group which inputs and outputs signals; selecting target port from other than the reference port of the port group; and detecting that conduction is made between the reference port and the target port.

The present invention is provided with a conduction detector which detects that conduction is made between input/output terminals for a reference port and target ports. Thus, whether conduction is made between the respective input/output terminals is detected prior to the output of signals from the reference port and the target port. Measures such as the supply of the same signal to the reference port and the target port are taken according to the result of detection, whereby logic levels of opposite polarity are outputted to the reference port and the target port, thus making it possible to prevent the flow of a short-circuit current.

Incidentally, the reference port is one obtained by selecting only one from a port group that inputs and outputs signals. The target ports may be selected from other than the reference port of the port group. The number of target ports may be one or plural.

The above and further objects and novel features of the invention will more fully appear from the following detailed description when the same is read in connection with the accompanying drawings. It is to be expressly understood,

DETAILED DESCRIPTION OF THE PREFERRED EMBODIMENTS

Concrete embodiments of an input/output device according to embodiments of the present invention will hereinafter be described in detail with reference to FIGS. 1 through 10.

First Embodiment

Figure 1:
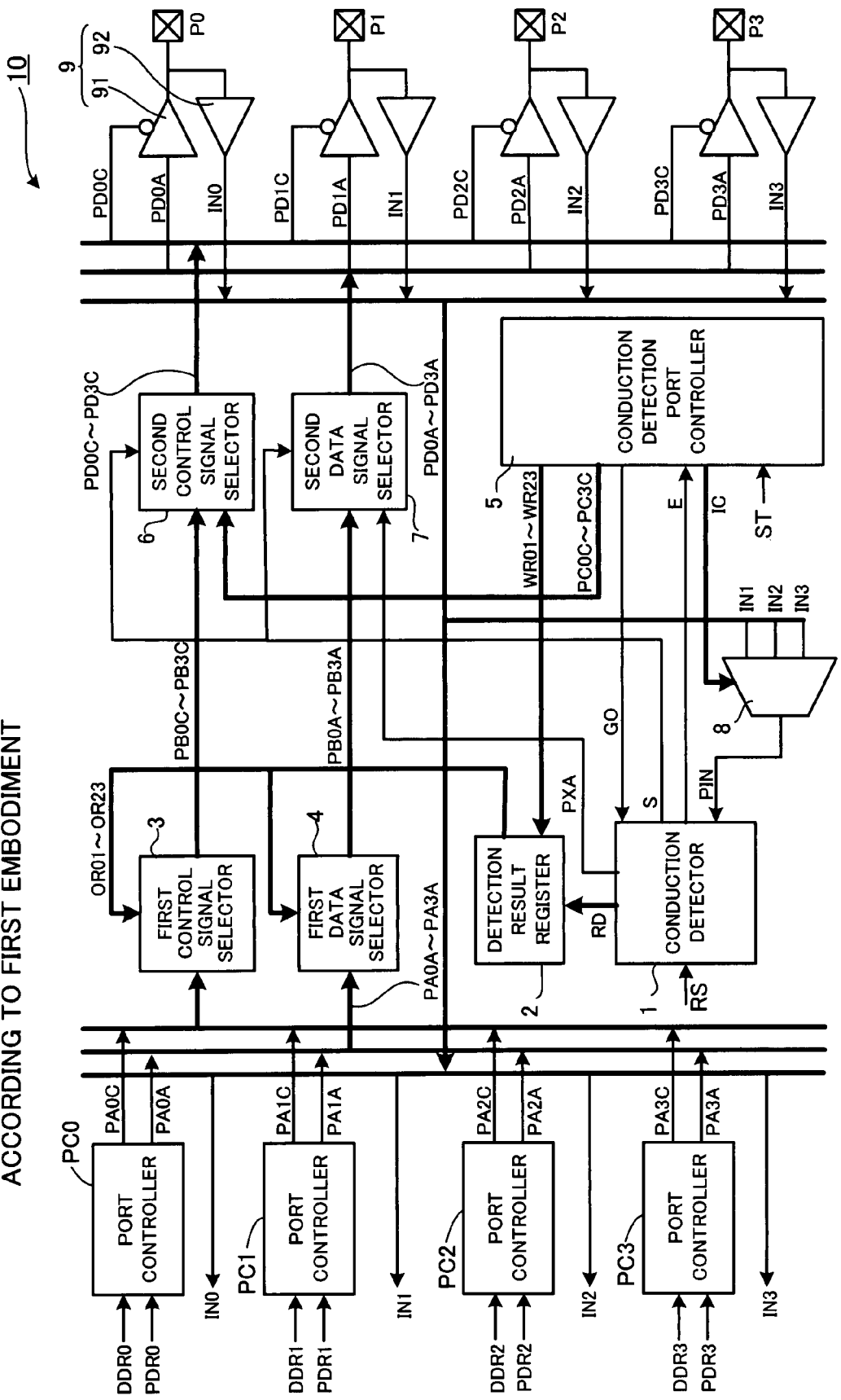
FIG. 1 is a block diagram showing a configuration of an input/output device according to a first embodiment.

FIG. 1 is a block diagram showing a configuration of an input/output device 10 according to a first embodiment. The input/output device 10 is a device which performs the input/output between an unillustrated CPU and input/output terminals P0 through P3 in a semiconductor device. The input/output device 10 detects that the input/output terminals P0 through P3 are made conductive to the outside and performs control in such a manner that the same output signal is forcefully outputted to each detected port. Described in detail, one of ports respectively connected to the input/output terminals P0 through P3 is defined as a reference port Pk, whereas the ports other than the reference port Pk are defined as target ports Pt. Then, conduction detection is made to all combinations of the reference port Pk and the target ports Pt while the reference port Pk and the target ports Pt are being switched. Results of their detection are stored in the detection result register 2. The reference port Pk and the target ports Pt are selected and controlled according to the detection results stored in the detection result register 2.

The input/output device 10 is provided with the conduction detector 1, detection result register 2, first control signal selector 3, first data signal selector 4, conduction detection port controller 5, second control signal selector 6, second data signal selector 7 and selector 8. The input/output device 10 includes port controllers PC0 through PC3 and input/output circuits 9.

The port controller PC0 inputs signals from a data direction register DDR0 (Data Direction Register) and a port data register PDR0 (Port Data Register) and outputs a control signal PAOC and a data signal PAOA. The port data register PDR0 is a register that stores data outputted from the CPU. The data direction register DDR0 is a register that specifies or designates the direction of output of the data stored in the port data register PDR0. Described specifically, a high level is written into the data direction register DDR0, thereby outputting the data stored in the port data register PDR0 from the input/output terminal P0. Incidentally, the port controllers PC1 through PC3 are also similar to the port controller PC0.

Each of the input/output circuits 9 includes a known output buffer 91 and a known input buffer 92. The output buffer 91 has a control terminal to which a control signal PD0C is inputted, and a data input terminal to which a data signal PD0A is inputted. When the control signal PD0C is low in level in the input/output circuit 9, the data signal PD0A is converted to a voltage level corresponding to a logic level of the input/output terminal P0, which in turn is outputted. When the control signal PD0C is high in level, high impedance is outputted. In the input buffer 92, the logic level of the input/output terminal P0 is converted to a voltage corresponding to an internal logic level, which in turn is inputted.

The conduction detector 1 detects whether the input/output ports corresponding to the reference port and target ports are made conductive to the outside. Described specifically, a detection port output signal PXA outputted to the corresponding target port is compared with a port input signal PIN inputted from the corresponding reference port, so that the conduction to the outside is detected.

Figure 2:
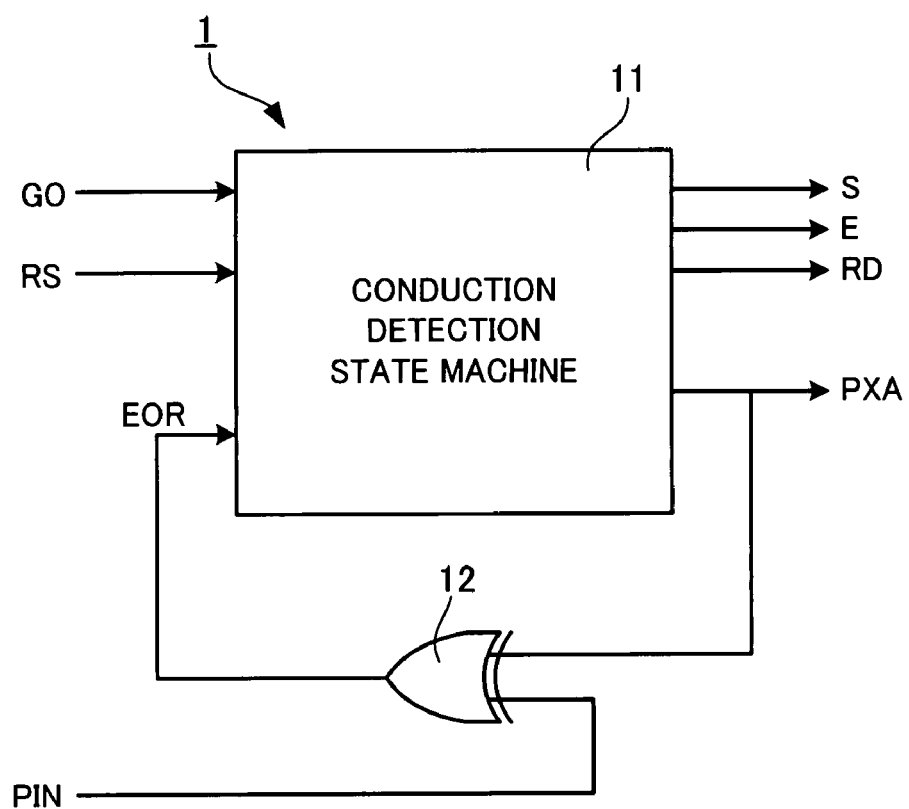
FIG. 2 is a circuit diagram illustrating a specific example of a conduction detector.

The conduction detector 1 will be explained with reference to FIGS. 2 and 3. FIG. 2 is a circuit diagram showing a specific example of the conduction detector 1. The conduction detector 1 is equipped with a conduction detection state machine 11 and an EOR gate 12. The conduction detection state machine 11 inputs an execution instruction signal GO sent from the conduction detection port controller 5, an independent operation instruction signal RS sent from an unillustrated independent operation permit register, and a decision signal EOR corresponding to the output of the EOR gate 12 and outputs a detection start signal S, a detection end signal E, a detection result signal RD and a detection port output signal PXA. The EOR gate 12 inputs the detection port output signal PXA at one end of its input and a port input signal PIN at its other end, and computes their exclusive OR and outputs the decision signal EOR. That is, when the detection port output signal PXA and the port input signal PIN coincide with each other in logic level, a low level is outputted as for the decision signal EOR.

Figure 3:
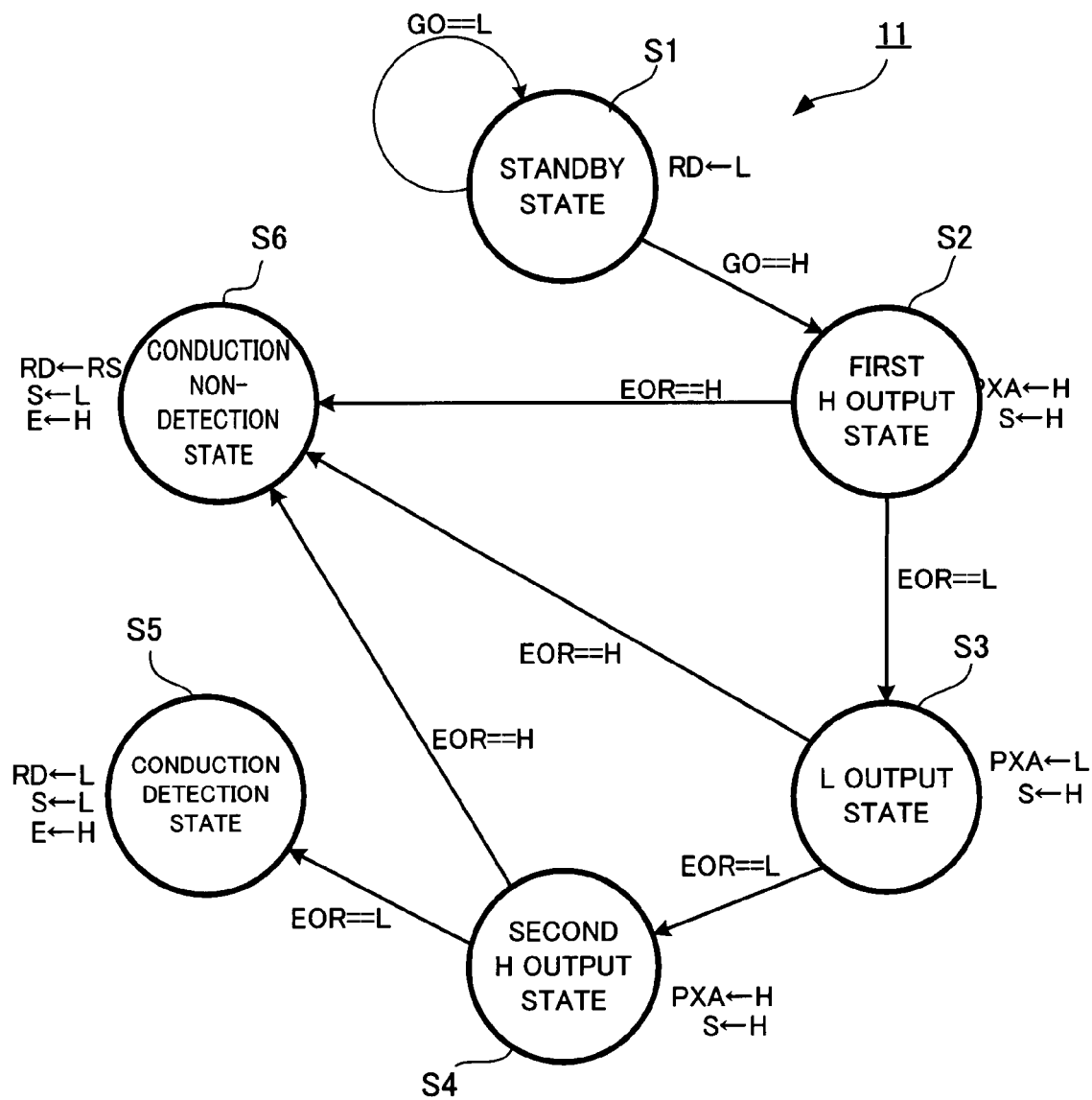
FIG. 3 is a state transition diagram depicting the operation of a conduction detection state machine.

FIG. 3 is a state transition diagram showing the operation of the conduction detection state machine.

In a standby state S1, the conduction detection state machine outputs a low level as the detection result signal RD and is placed on standby until the execution instruction signal GO is transitioned to a high level. When the execution instruction signal GO is transitioned to the high level, the conduction detection state machine proceeds to a first H output state S2 and starts execution of conduction detection.

In the first H output state S2, the conduction detection state machine outputs a high level as for the detection port output signal PXA and outputs a high level as for the detection start signal S. Thus, a high level is outputted to the reference port Pk, and a logic level inputted to each target port Pt and the detection port output signal PXA are compared at the EOR gate 12. As a result of its comparison, the conduction detection state machine proceeds to an L output state S3 where the detection port output signal PXA and the port input signal PIN coincide with each other and the decision signal EOR is low in level, whereas the conduction detection state machine proceeds to a conduction non-detection state S6 where the decision signal EOR is high in level.

In the L output state S3, the conduction detection state machine outputs a low level as for the detection port output signal PXA and outputs a high level as for the detection start signal S. Thus, a low level is outputted to the reference port Pk, and a logic level inputted to each target port Pt and the detection port output signal PXA are compared at the EOR gate 12. As a result of its comparison, the conduction detection state machine proceeds to a second H output state S4 where the detection port output signal PXA and the port input signal PIN coincide with each other and the decision signal EOR is low in level, whereas the conduction detection state machine proceeds to a conduction non-detection state S6 where the decision signal EOR is high in level.

In the second H output state S4, the conduction detection state machine outputs a high level as for the detection port output signal PXA and a high level as for the detection start signal S. Thus, a high level is outputted to the reference port Pk, and a logic level inputted to each target port Pt and the detection port output signal PXA are compared at the EOR gate 12. As a result of its comparison, the conduction detection state machine proceeds to a conduction detection state S5 where the detection port output signal PXA and the port input signal PIN coincide with each other and the decision signal EOR is low in level, whereas when the decision signal EOR is high in level, the conduction detection state machine proceeds to the conduction non-detection state S6.

Since it is determined in the conduction detection state S5 that the reference port Pk and each target port Pt are brought into conduction, a low level is outputted as for the detection result signal RD. In order to notify the completion of the conduction detecting operation, a low level is outputted as for the detection start signal S, and a high level is outputted as for the detection end signal E, respectively.

Since it is judged in the conduction non-detection state S6 that the reference port Pk and each target port Pt are non-conductive, an independent operation instruction signal RS is outputted as for the detection result signal RD. In order to notify the completion of the conduction detecting operation, a low level is outputted as for the detection start signal S, and a high level is outputted as for the detection end signal E, respectively.

Figure 4:
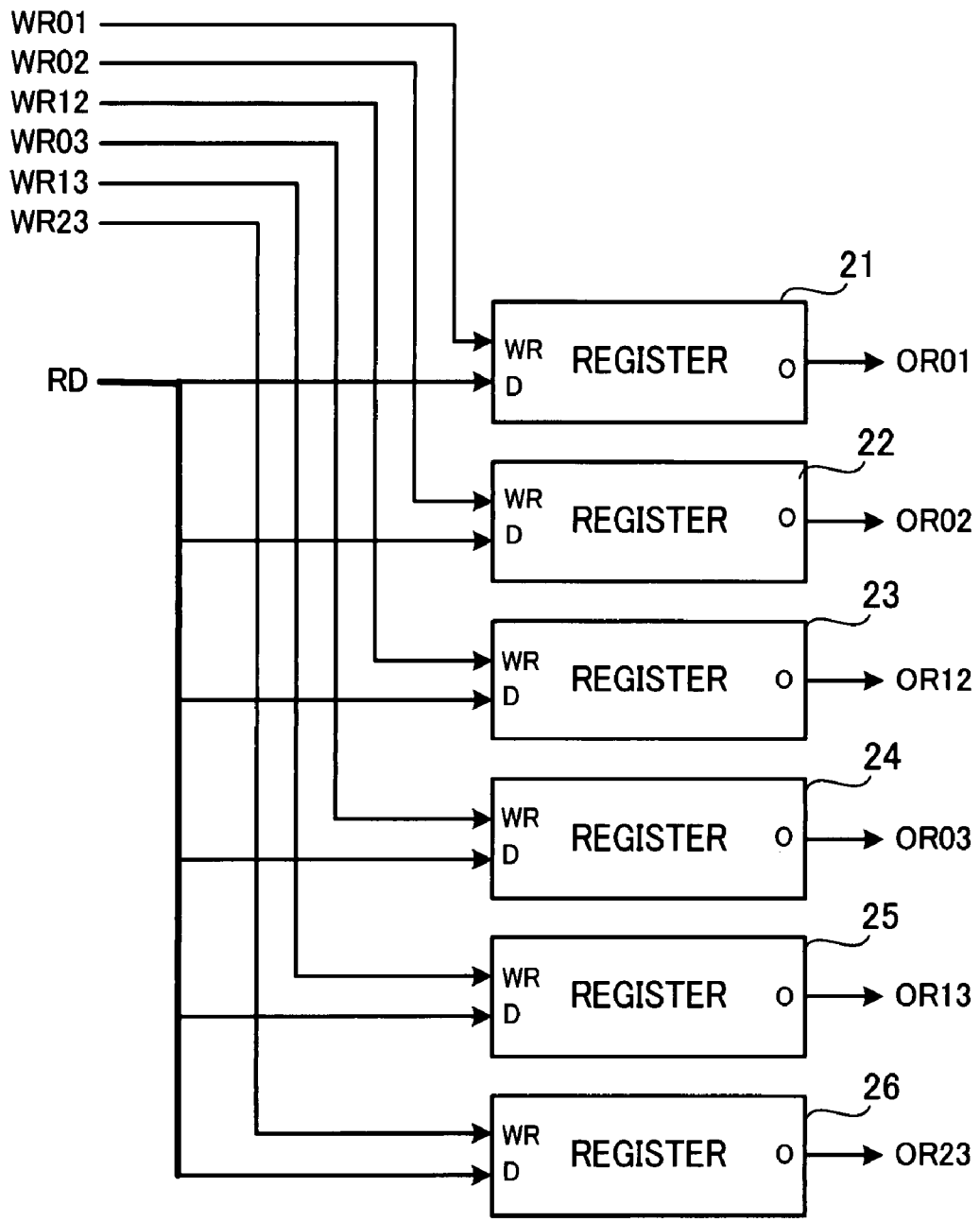
FIG. 4 is a circuit diagram illustrating a specific example of a detection result register.

The detection result register 2 will next be explained. FIG. 4 is a circuit diagram showing a specific example of the detection result register 2. The detection result register 2 is provided with registers 21 through 26 independent of one another. The value of a detection result signal RD is stored in the registers associated with the combinations of the reference port Pk and the target ports Pt in the detection result register 2. The detection result signal RD is inputted to input data terminals D of the registers 21 through 26. Write control signals WR01, WR02, WR12, WR03, WR13 and WR23 are inputted to their corresponding write control terminals WR of the registers 21 through 26. The registers 21 through 26 output their contents as register output signals OR01, OR02, OR12, OR03, OR13 and OR23. Assuming now that the write control signals WR01, WR02, WR12, WRO3, WR13 and WR23 are respectively transitioned to a high level, the contents of the detection result signal RD are stored in the corresponding registers. When, for example, the write control signal WR01 is transitioned to the high level, the contents of the detection result signal RD are stored in the register 21.

Figure 5:
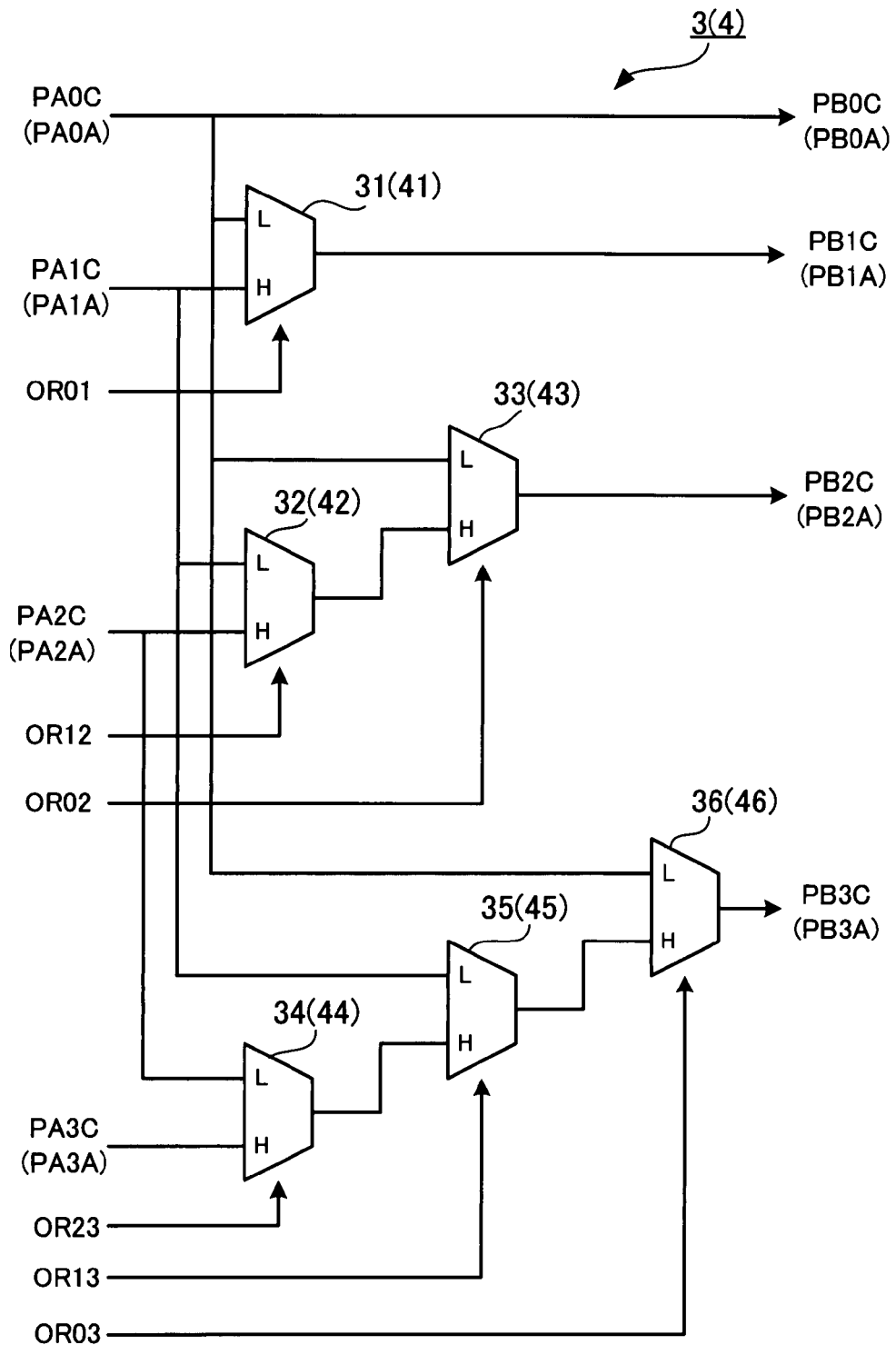
FIG. 5 is a circuit diagram showing a specific example illustrative of each of a first control signal selector and a first data signal selector.

The first control signal selector 3 and the first data signal selector 4 will next be described. FIG. 5 is a circuit diagram showing a specific example of each of the first control signal selector 3 and the first data signal selector 4. The first control signal selector 3 is provided with selectors 31 through 36.

In the selector 31, a control signal PA0C is inputted to one input terminal thereof, a control signal PA1C is inputted to the other input terminal thereof, and a register output signal OR01 is inputted to a control terminal thereof, respectively. When the register output signal OR01 is high in level, that is, the input/output terminal P0 and the input/output terminal P1 are not brought into conduction, the control signal PA1C is selected and outputted as for a control signal PB1C. Since the register output signal OR01 is rendered low in level when the conduction of the input/output terminals P0 and P1 is detected, the control signal PA0C is selected and outputted as for a control signal PB1C. That is, the same logic level is outputted as for each of the control signals PB0C and PB1C.

In the selector 32, the control signal PA1C is inputted to one input terminal thereof, a control signal PA2C is inputted to the other input terminal thereof, and the register output signal OR12 is inputted to a control terminal thereof, respectively. In the selector 33, the control signal PA0C is inputted to one input terminal thereof, the output of the selector 32 is inputted to the other input terminal thereof, and the register output signal OR02 is inputted to a control terminal thereof, respectively. When the register output signal OR02 and the register output signal OR12 are high in level, that is, the input/output terminal P2 is not conductive even to both the input/output terminal P0 and the input/output terminal P1, the control signal PA2C is selected and outputted as for a control signal PB2C. When the input/output terminal P2 is made conductive to the input/output terminal P1 and non-conductive to the input/output terminal P0, the control signal PA1C is selected and outputted as for the control signal PB2C. That is, the same logic level is outputted as for each of the control signals PB1C and PB2C. When the input/output terminal P2 is made conductive to the input/output terminal P0, the control signal PA0C is selected and outputted as for the control signal PB2C. That is, the same logic level is outputted as for each of the control signals PB0C and PB2C.

In the selector 34, the control signal PA2C is inputted to one input terminal thereof, a control signal PA3C is inputted to the other input terminal thereof, and the register output signal OR23 is inputted to a control terminal thereof, respectively. In the selector 35, the control signal PA1C is inputted to one input terminal thereof, the output of the selector 34 is inputted to the other input terminal thereof, and the register output signal OR13 is inputted to a control terminal thereof, respectively. In the selector 36, the control signal PA0C is inputted to one input terminal thereof, the output of the selector 35 is inputted to the other input terminal thereof, and the register output signal OR03 is inputted to a control signal thereof, respectively. When the register output signal OR03, the register output signal OR13 and the register output signal OR23 are high in level, that is, the input/output terminal P3 is not conductive to any of the input/output terminals P0 through P2, the control signal PA3C is selected and outputted as for a control signal PB3C. When the input/output terminal P3 is made conductive to the input/output terminal P2 and non-conductive to the input/output terminal P0 and the input/ output terminal P1, the control signal PA2C is selected and outputted as for the control signal PB3C. That is, the same logic level is outputted as for each of the control signals PB2C and PB3C. When the input/output terminal P3 is made conductive to the input/output terminal P1 and non-conductive to the input/output terminal P0, the control signal PA1C is selected and outputted as for the control signal PB3C. That is, the same logic level is outputted as for each of the control signals PB1C and PB3C. When the input/output terminal P3 is made conductive to the input/output terminal P0, the control signal PA0C is selected and outputted as for the control signal PB3C. That is, the same logic level is outputted as for each of the control signals PB0C and PB3C.

The first data signal selector 4 is equipped with selectors 41 through 46. Incidentally, data signals PA0A through PA3A are substituted for the control signals PA0C through PA3C used as the inputs in the first control signal selector 3, and data signals PB0A through PB3A are substituted for the control signals PB0C through PB3C used as the outputs. In a manner similar to the first control signal selector 3, the register output signals OR01, OR02, OR03, OR12, OR13 and OR23 are inputted to their corresponding control terminals of the selectors 41 through 46. Thus, since the first data signal selector 4 performs an operation similar to that of the first control signal selector 3, its detailed description is omitted.

Figure 6:
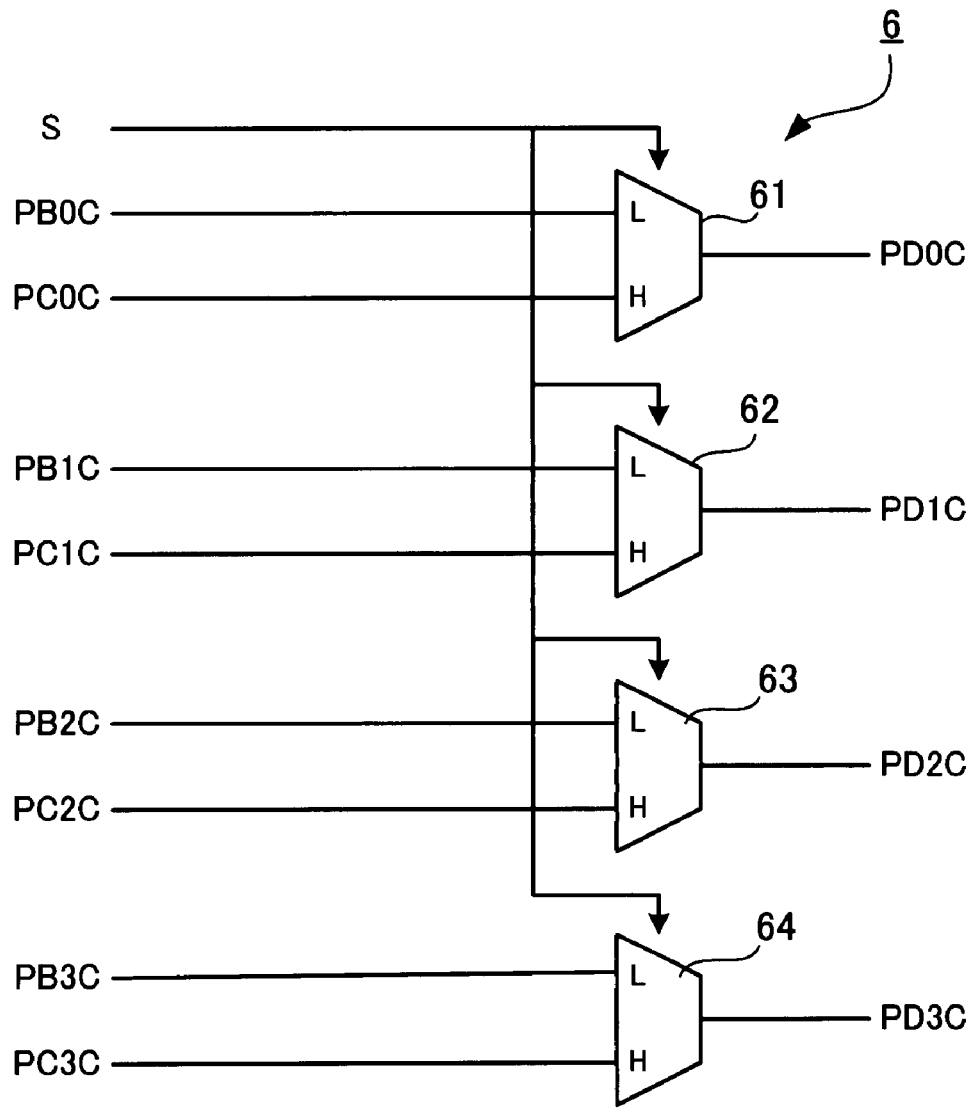
FIG. 6 is a circuit diagram illustrating a specific example of a second control signal selector.

The second control signal selector 6 will next be explained. FIG. 6 is a circuit diagram showing a specific example of the second control signal selector 6.

The second control signal selector 6 includes selectors 61 through 64. The control signals PB0C through PB3C are respectively inputted to one input terminals of the selectors 61 through 64, whereas control signals PC0C through PC3C are respectively inputted to the other input terminals thereof. The detection start signal S is inputted to control terminals of the selectors 61 through 64 respectively. When the detection start signal S is low in level in the selectors 61 through 64, that is, they are in a normal operation free of execution of a detecting operation, the control signals PB0C through PB3C are selected and outputted as for control signals PD0C through PD3C. When the detection start signal S is high in level, i.e., the detecting operation is performed, the control signals PC0C through PC3C are selected and outputted as for the corresponding control signals PD0C through PD3C.

Figure 7:
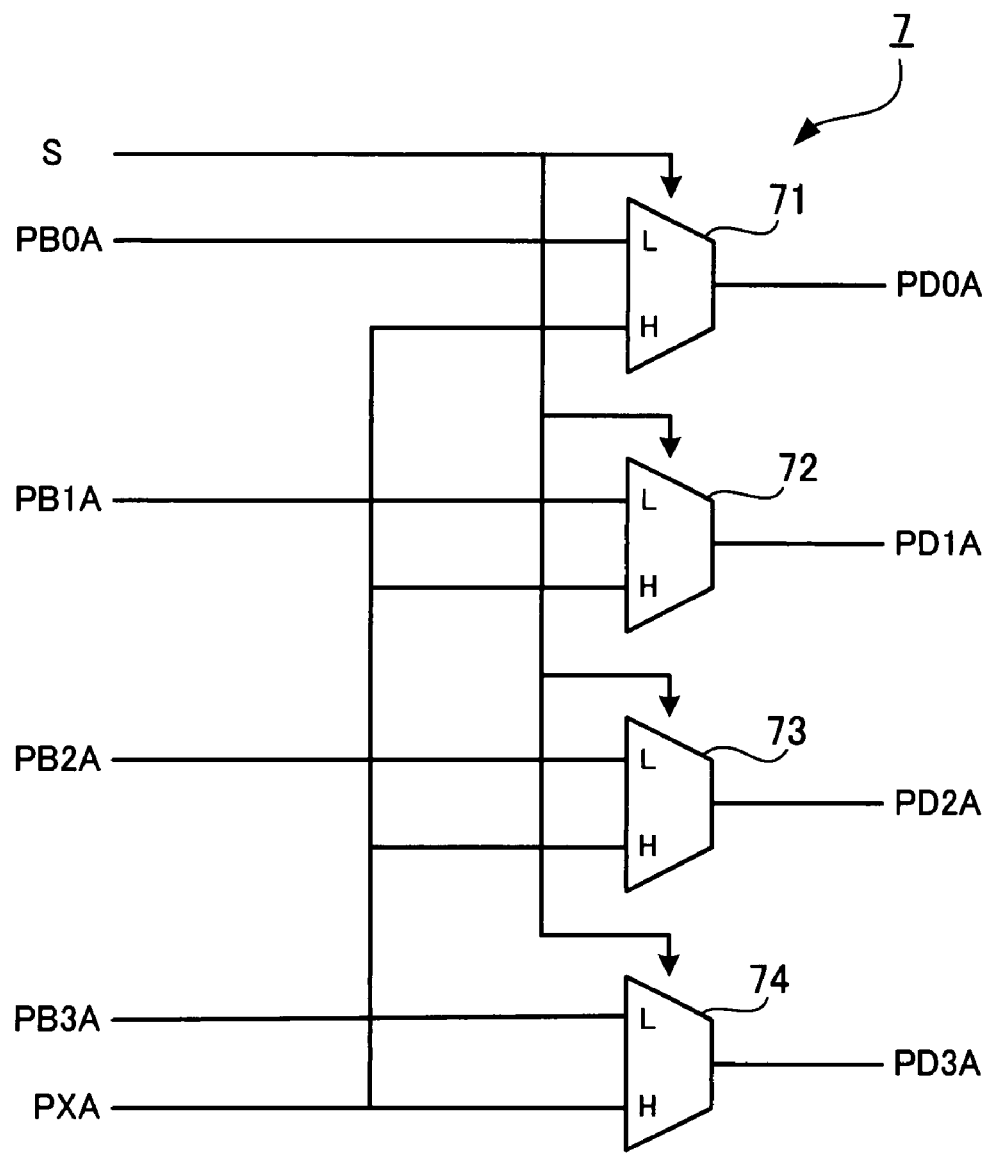
FIG. 7 is a circuit diagram depicting a specific example of a second data signal selector.

The second data signal selector 7 will next be explained. FIG. 7 is a circuit diagram showing a specific example of the second data signal selector 7.

The second data signal selector 7 includes selectors 71 through 74. The data signals PB0A through PB3A are inputted to one input terminals of the selectors 71 through 74, the detection port output signal PXA is inputted to the other input terminals thereof, and the detection start signal S is inputted to control terminals thereof, respectively. When the detection start signal S is low in level in the selectors 71 through 74, i.e., they are in a normal operation free of execution of a detecting operation, the data signals PB0A through PB3A are selected and outputted as for data signals PD0A through PD3A. When the detection start signal S is high in level, i.e., the detecting operation is performed, the detection port output signal PXA is selected for the selectors 71 through 74 respectively and outputted as for the corresponding data signals PD0A through PD3A.

The conduction detection port controller 5 will next be described. The conduction detection port controller 5 inputs a start signal ST and the detection end signal E and outputs control signals PC0C through PC3C, write control signals WR01 through WR23 and a target port input control signal IC.

Figure 8:
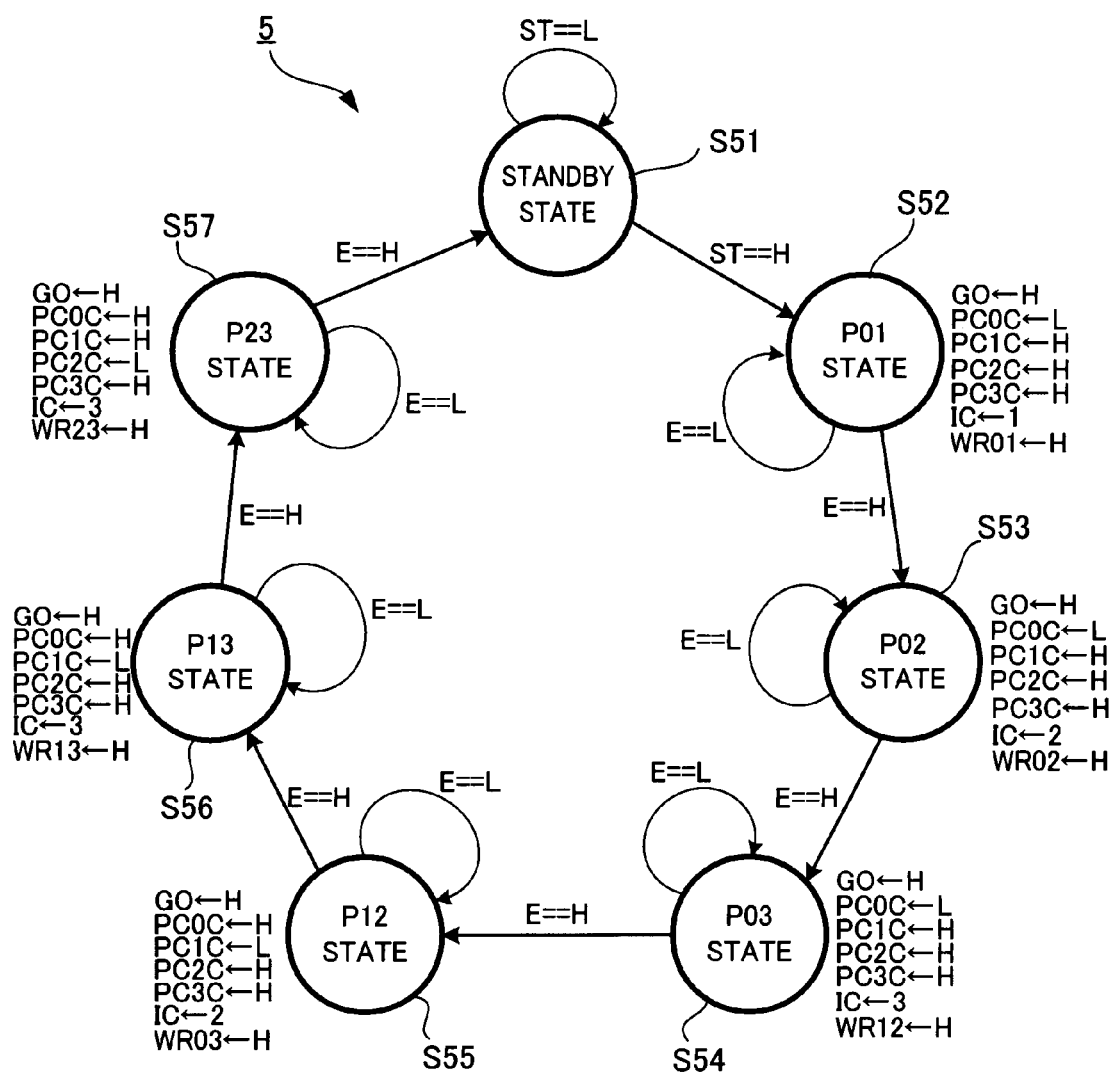
FIG. 8 is a state transition diagram showing the operation of a conduction detection port controller.

FIG. 8 is a state transition diagram showing the operation of the conduction detection port controller 5. The conduction detection port controller 5 is of a state machine having 7 states comprising a standby state S51, a P01 state S52, a P02 state S53, a P03 state S54, a P12 state S55, a P13 state S56 and a P23 state S57. In the conduction detection port controller 5, state transition is started with the transition of the start signal ST to a high level. Every P01 state S52 to P23 state S57, their corresponding conduction detections for reference port Pk and target ports Pt are performed, and their states are transitioned each time the detection end signal E is detected.

In the standby state S51, the conduction detection port controller 5 waits for the transition of the start signal ST to the high level. When the start signal ST is transitioned to the high level, the conduction detection port controller 5 proceeds to the P01 state S52.

Since the execution instruction signal GO is rendered high in level in the P01 state S52, the conduction detector 1 starts a detecting operation. Since, at this time, the detection start signal S is transitioned to the high level and the control signal PC0C is rendered low in level, the detection port output signal PXA sent from the conduction detector 1 is outputted to its corresponding input/output terminal P0. Since the control signal PC1C is rendered high in level and the target port input control signal IC is brought to 1, a logic level from the input/output terminal P1 is inputted as the port input signal PIN of the conduction detector 1. Thus, conduction detection is performed in which the reference port Pk is set as the input/output terminal P0 and the target port Pt is set as the input/output terminal P1. Since the write control signal WR01 is rendered high in level, the result of conduction detection is stored in the register 21. When the detecting operation is completed and the detection end signal E outputted from the conduction detector 1 is transitioned to the high level, the conduction detection port controller 5 proceeds to the P02 state S53.

Since the execution instruction signal GO is brought to a high level in the P02 state S53, the conduction detector 1 starts its detecting operation. Since, at this time, the detection start signal S is transitioned to the high level and the control signal PC0C is rendered low in level, the detection port output signal PXA from the conduction detector 1 is outputted to the input/output terminal P0. Since the control signal PC2C is rendered high in level and the target port input control signal IC is brought to 2, a logic level from the input/output terminal P2 is inputted as the port input signal PIN of the conduction detector 1. Thus, conduction detection is performed in which the reference port Pk is set as the input/output terminal P0 and the target port Pt is set as the input/output terminal P2. Since the write control signal WR02 is rendered high in level, the result of conduction detection is stored in the register 22. When the detecting operation is completed and the detection end signal E outputted from the conduction detector 1 is transitioned to the high level, the conduction detection port controller 5 proceeds to the P03 state S54.

Since the execution instruction signal GO is brought to a high level in the P03 state S54, the conduction detector 1 starts its detecting operation. Since, at this time, the detection start signal S is transitioned to the high level and the control signal PC0C is rendered low in level, the detection port output signal PXA from the conduction detector 1 is outputted to the input/output terminal P0. Since the control signal PC3C is rendered high in level and the target port input control signal IC is brought to 3, a logic level from the input/output terminal P3 is inputted as the port input signal PIN of the conduction detector 1. Thus, conduction detection is performed in which the reference port Pk is set as the input/output terminal P0 and the target port Pt is set as the input/output terminal P3. Since the write control signal WR03 is rendered high in level, the result of conduction detection is stored in the register 24. When the detecting operation is completed and the detection end signal E outputted from the conduction detector 1 is transitioned to the high level, the conduction detection port controller 5 proceeds to the P12 state S55.

Since the execution instruction signal GO is rendered high in level in the P12 state S55, the conduction detector 1 starts its detecting operation. Since, at this time, the detection start signal S is transitioned to the high level and the control signal PC1C is rendered low in level, the detection port output signal PXA from the conduction detector 1 is outputted to the input/output terminal P1. Since the control signal PC2C is rendered high in level and the target port input control signal IC is brought to 2, the logic level from the input/output terminal P2 is inputted as the port input signal PIN of the conduction detector 1. Thus, conduction detection is performed in which the reference port Pk is set as the input/output terminal P1 and the target port Pt is set as the input/output terminal P2. Since the write control signal WR12 is rendered high in level, the result of conduction detection is stored in the register 23. When the detecting operation is completed and the detection end signal E outputted from the conduction detector 1 is transitioned to the high level, the conduction detection port controller 5 proceeds to the P13 state S56.

Since the execution instruction signal GO is rendered high in level in the P13 state S56, the conduction detector 1 starts its detecting operation. Since, at this time, the detection start signal S is transitioned to the high level and the control signal PC1C is rendered low in level, the detection port output signal PXA from the conduction detector 1 is outputted to the input/output terminal P1. Since the control signal PC3C is rendered high in level and the target port input control signal IC is brought to 3, the logic level from the input/output terminal P3 is inputted as the port input signal PIN of the conduction detector 1. Thus, conduction detection is performed in which the reference port Pk is set as the input/output terminal P1 and the target port Pt is set as the input/output terminal P3. Since the write control signal WR13 is rendered high in level, the result of conduction detection is stored in the register 25. When the detecting operation is completed and the detection end signal E outputted from the conduction detector 1 is transitioned to the high level, the conduction detection port controller 5 proceeds to the P23 state S57.

Since the execution instruction signal GO is rendered high in level in the P23 state S57, the conduction detector 1 starts its detecting operation. Since, at this time, the detection start signal S is transitioned to the high level and the control signal PC2C is rendered low in level, the detection port output signal PXA from the conduction detector 1 is outputted to the input/output terminal P2. Since the control signal PC3C is rendered high in level and the target port input control signal IC is brought to 3, the logic level from the input/output terminal P3 is inputted as the port input signal PIN of the conduction detector 1. Thus, conduction detection is performed in which the reference port Pk is set as the input/output terminal P2 and the target port Pt is set as the input/output terminal P3. Since the write control signal WR23 is rendered high in level, the result of conduction detection is stored in the register 26. When the detecting operation is completed and the detection end signal E outputted from the conduction detector 1 is transitioned to the high level, the conduction detection port controller 5 returns to the standby state S51.

In the input/output device 10, the above detecting operation is performed prior to the use of the input/output device 10. Described specifically, as examples of the time of execution of the detecting operation may be mentioned, for instance, ones at the time of reset release of a system, power-up, port initialization and the like. Upon debugging of a program such as firmware or the like, it is carried out upon an ICE (In Circuit Emulator) startup and at the time of the occurrence of a start-up signal from the program.

In the input/output device 10 of the first embodiment, the operation of performing conduction detection between the adjacent respective input/output terminals is carried out prior to its use. When the conduction is detected, such output control as to avoid the output of levels of other polarity is carried out regardless of the designation of an output by a program. It is thus possible to prevent a short-circuit current from flowing through the input/output device 10 and prevent degradation in reliability due to the short-circuit current. Since the existing circuit can be used as each input/output circuit 9, a per-unit input/output circuit can be brought into a simple configuration.

Second Embodiment

An input/output device 10A according to a second embodiment will next be explained. The input/output device 10A according to the second embodiment is different from the input/output device 10 according to the first embodiment in that an input/output circuit 9A is used in place of each input/output circuit 9 in the input/output device 10 according to the first embodiment. Thus, the detailed description of different portions is performed and the description of similar portions is omitted or simplified.

Figure 9:
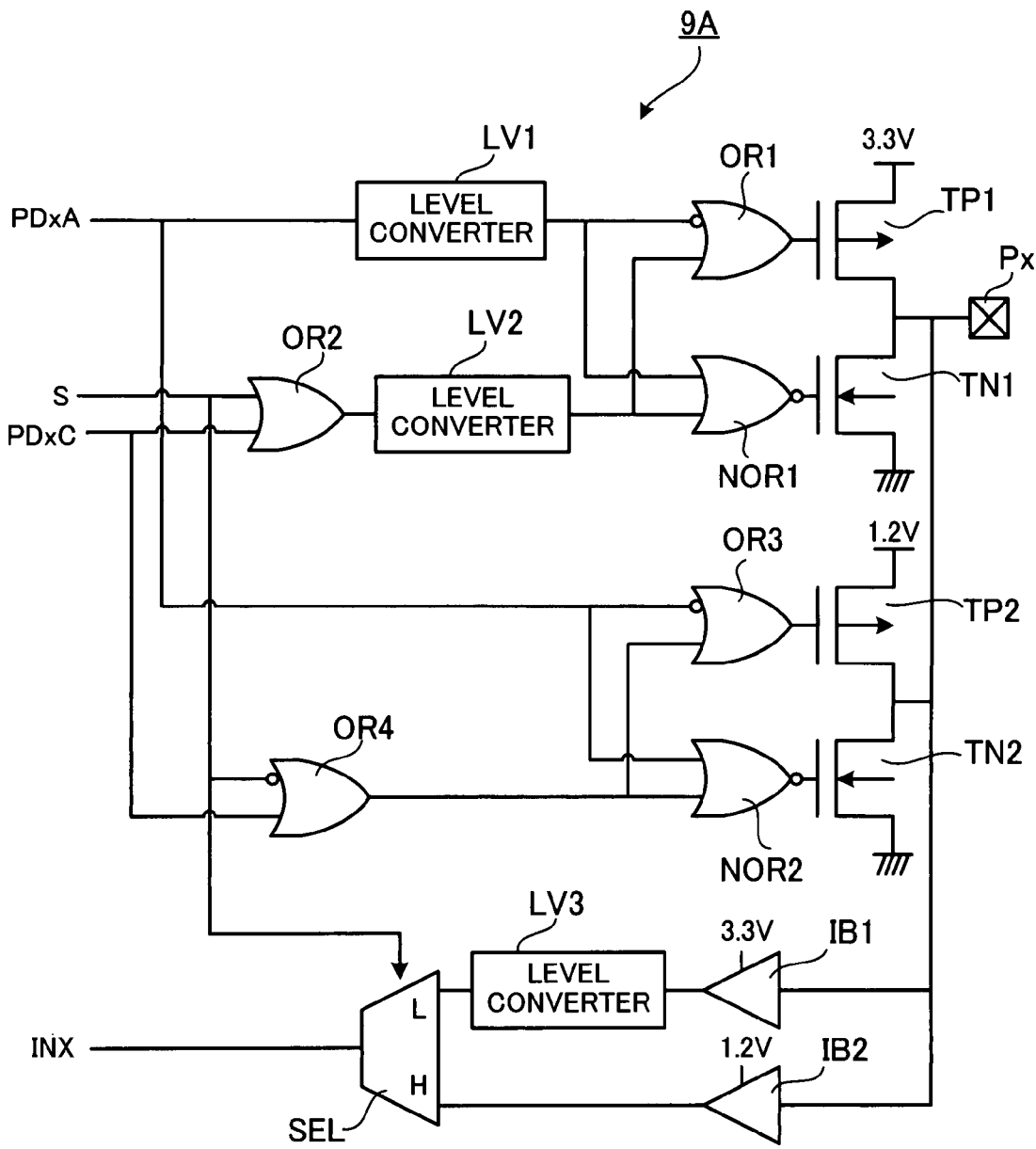
FIG. 9 is a circuit diagram illustrating a configuration of an input/output circuit of an input/output device according to a second embodiment.

FIG. 9 is a circuit diagram showing a configuration of the input/output circuit 9A of the input/output device 10A according to the second embodiment. The input/output circuit 9A includes OR gates OR1 through OR4, NOR gates NOR1 and NOR2, level converters LV1 through LV3, P-type transistors TP1 and TP2, N-type transistors TN1 and TN2, input buffers IB1 and IB2, and a selector SEL. The input/output circuit 9A performs the input/output with respect to input/output terminals Px (where x=0 through 3).

Of these, the level converters LV1 and LV2, OR gate OR1, NOR gate NOR1, P-type transistor TP1 and N-type transistor TN1 constitute a three-state output circuit whose logic high level output voltage is 3.3V. Data signals PDxA (where x=0 through 3) are connected to a data input of the three-state output circuit, and the output of the OR gate OR2 is connected to its control input. In the OR gate OR2, a detection start signal S is inputted to one input terminal thereof, and control signals PDxC (where x=0 through 3) are inputted to the other input terminal thereof. Thus, when the detection start signal S is high in level, that is, a conduction detecting operation is done, the output of the OR gate OR1 is rendered high in level and the output of the NOR gate NOR1 is rendered low in level, so that the P-type transistor TP1 and the N-type transistor TN1 are brought into non-conduction.

The OR gate OR3, NOR gate NOR2, P-type transistor TP2 and N-type transistor TN2 constitute a three-state output circuit whose logic high level output voltage is 1.2V. The data signals PDxA are inputted to a data input of the three-state output circuit, and the output of the OR gate OR4 is inputted to its control input terminal. In the OR gate OR4, the detection start signal S is inputted to one input terminal thereof on the negative logic side, and the control signals PDxC are inputted to the other input terminal thereof. Thus, when the detection start signal S is low in level, that is, the conduction detecting operation is not performed, the output of the OR gate OR3 is rendered high in level and the output of the NOR gate NOR2 is rendered low in level, so that the P-type transistor TP2 and the N-type transistor TN2 are brought into non-conduction.

The input buffer IB1 is an input circuit whose source voltage is set as 3.3V. The input buffer IB2 is an input circuit whose source voltage is set as 1.2V. In the selector SEL, the output of the input buffer IB1 is connected to one input terminal thereof, the output of the input buffer IB2 is connected to the other input terminal thereof, and the detection start signal S is connected to a control terminal thereof. When the detection start signal S is low in level, that is, the conduction detecting operation is not performed, the output of the input buffer IB1 is outputted as for input signals INx (where x=0 through 3). When the detection start signal S is high in level, that is, the conduction detecting operation is done, the output of the input buffer IB2 is outputted as for input signals INx.

Upon the normal operation free of the conduction detecting operation in the input/output device 10A according to the second embodiment, the signals are outputted from the three-state output circuit whose source voltage is 3.3V, and the signals are inputted from the input circuit whose source voltage is 3.3V. On the other hand, when the conduction detecting operation is done, the signals are outputted from the three-state output circuit whose source voltage is 1.2V, and the signals are inputted from the input circuit whose source voltage is 1.2V.

Meanwhile, there is a case in which in the input/output device 10 according to the first embodiment, equipment connected to the outside malfunctions upon the conduction detecting operation. When, for example, an LED constituting a light-emitting source of a photosensor is connected to its corresponding input/output terminal, the LED emits light upon the conduction detecting operation. In such a case, a problem arises in that the photosensor incurs a malfunction. In contrast, the input/output device 10A according to the second embodiment can reduce an influence exerted on the equipment connected to the outside because it is driven by the three-state output circuit whose source voltage is 1.2V, upon the conduction detecting operation.

Third Embodiment

An input/output device 10B according to a third embodiment will next be explained. The input/output device 10B according to the third embodiment is different from the input/output device 10 according to the first embodiment in that an input/output circuit 9B is used in place of the input/output circuit 9 in the input/output device 10, a switch SW is used in place of the selector 8, and an A/D converter ADC and a digital comparator DC are used in place of the EOR gate 12. Thus, different portions will be described in detail, and the description of similar portions will be omitted or simplified.

Figure 10:
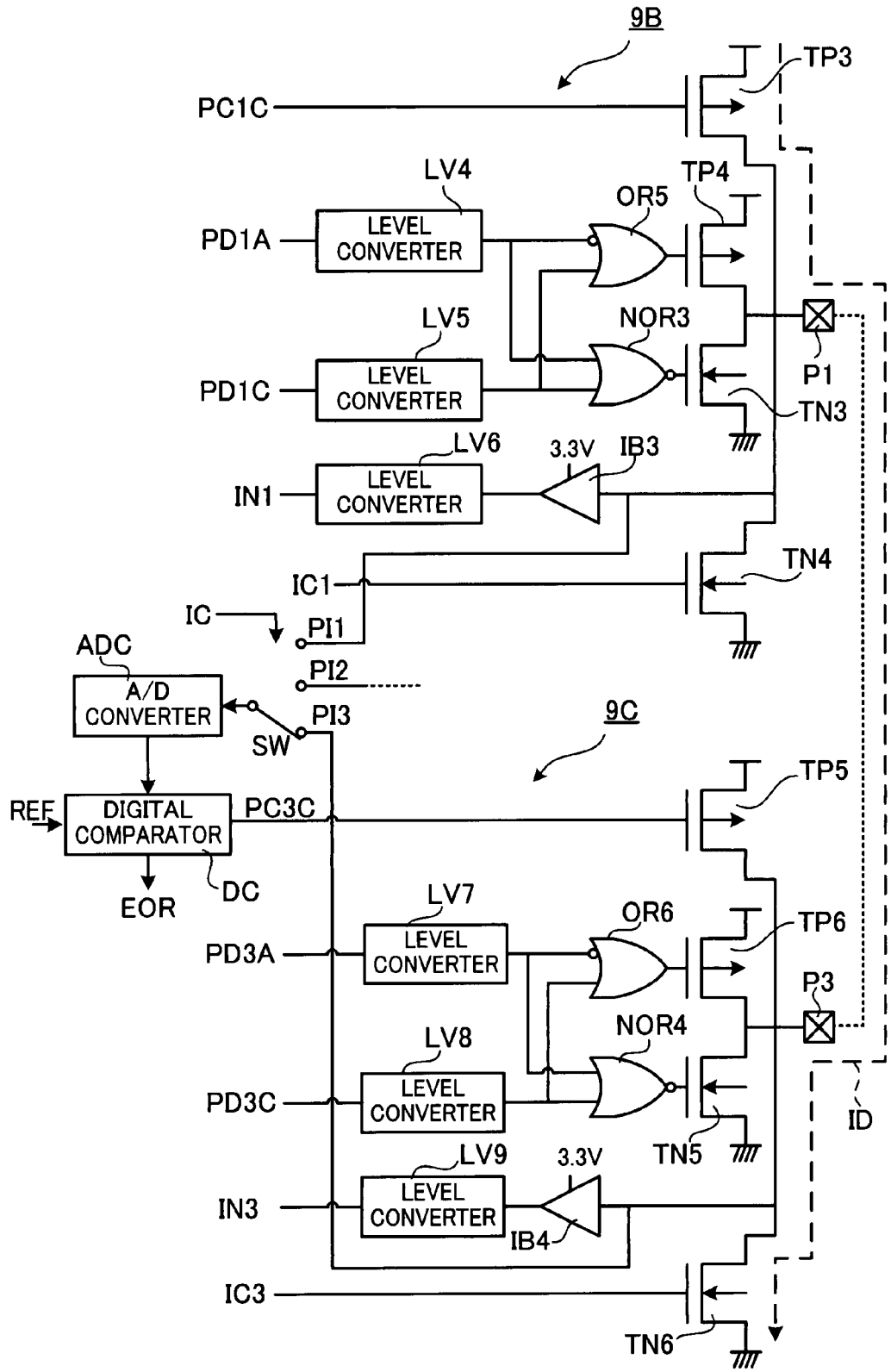
FIG. 10 is a circuit diagram depicting a configuration of an input/output device according to a third embodiment.
Figure 11:
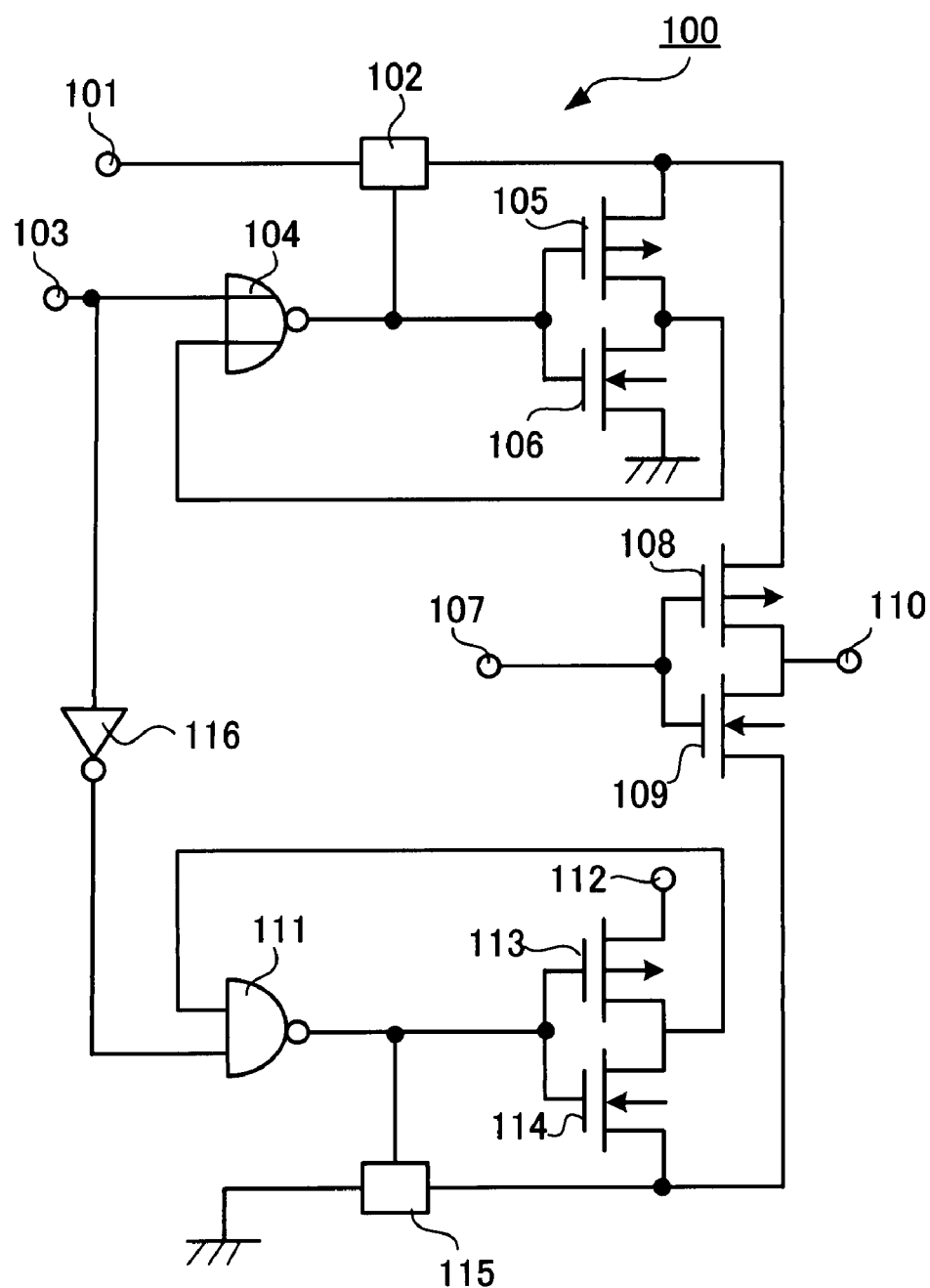
FIG. 11 is a circuit diagram of a semiconductor integrated device according to a related art.

FIG. 10 is a circuit diagram showing a configuration of the input/output device 10B according to the third embodiment. The input/output circuit 9B includes an OR gate OR5, a NOR gate NOR3, level converters LV4 through LV6, P-type transistors TP3 and TP4, N-type transistors TN3 and TN4 and an input buffer IB3, and performs the input/output with respect to an input/output terminal P1.

Of these, the level converters LV4 and LV5, the OR gate OR5, the NOR gate NOR3, the P-type transistor TP4 and the N-type transistor TN3 constitute a three-state output circuit. A data signal PD1A is connected to a data input of the three-state output circuit, and a control signal PD1C is connected to its control input thereof. A logic level of the input/output terminal P1 is transmitted to an input signal IN1 via the input buffer IB3 and the level converter LV6. Aside from the input signal IN1, an input signal PI1 directly taken out from the drain of the N-type transistor TN4 is also outputted from the input/output circuit 9B.

In the P-type transistor TP3, its gate is connected to a control signal PC1C and its drain is connected to the input/output terminal P1. In the N-type transistor TN4, its gate is connected to a target port input control signal IC1 and its drain is connected to the input/output terminal P1. Here, the target port input control signal IC1 is a signal obtained by encoding a target port input control signal IC and is a signal brought to a high level where the target port input control signal IC is 1. In addition, a target port input control signal IC2 is brought to a high level where the target port input control signal IC is 2. A target port input control signal IC3 is brought to a high level where the target port input control signal IC is 3.

An input/output circuit 9C is provided with an OR gate OR6, a NOR gate NOR4, level converters LV7 through LV9, P-type transistors TP5 and TP6, N-type transistors TN5 and TN6, and an input buffer IB4. The input/output circuit 9C has a configuration similar to the input/output circuit 9B and performs the input/output with respect to an input/output terminal P3. A control signal PC3C is inputted to the gate of the P-type transistor TP5, and a target port input control signal IC3 is inputted to the gate of the N-type transistor TN6.

In the switch SW disposed in place of the selector 8 in the input/output device 10, the input signals PI1 through PI3 outputted from their corresponding input/output circuits are switched according to the target port input control signal IC, followed by being outputted to the A/D converter ADC. The A/D converter ADC converts the analog voltage inputted through the switch SW to a digital value and outputs the same to the digital comparator DC. The digital comparator DC compares the digital value outputted from the A/D converter ADC with a threshold value REF. When the digital value exceeds the threshold value REF, the digital comparator DC outputs a low level as a decision signal EOR. When the low level is outputted as the decision signal EOR, a conduction detector 1 immediately proceeds to a conduction detection state S5, whereas when a high level is outputted as the decision signal EOR, the conduction detector 1 immediately proceeds to a conduction non-detection state S6.

The operation of the input/output device 10B at the time that a conduction detection port controller 5 is placed in a P13 state S56 will be explained. In the P13 state S56, a low level is outputted as for a control signal PC1C, 3 is outputted as for the target port input control signal IC, and a high level is outputted as for the target port input control signal IC3. Thus, the P-type transistor TP3 and the N-type transistor TN6 are respectively brought into a conducting state.

Incidentally, when the input/output terminal P1 and the input/output terminal P3 conduct outside, a path of a detection current ID, which extends from a source potential to a ground potential through the P-type transistor TP3 and the N-type transistor TN6 is formed. On the other hand, since the input signal PI3 is selected by the switch SW, the digital comparator DC compares a digital value of a drain potential of the N-type transistor TN6 with the threshold value REF. When the input/output terminal P1 and the input/output terminal P3 are not brought into conduction, the drain potential of the N-type transistor TN6 is brought to approximately 0V. When, however, the input/output terminal P1 and the input/output terminal P3 are brought into conduction, an electromotive force of ID* (ON resistance of TN6) occurs. The conduction detection of the input/output terminal P1 and the input/output terminal P3 can be carried out by setting the threshold value REF to a digital value of ½*ID* (ON resistance of TN6). Incidentally, the ON resistances of the P-type transistor TP3 and the N-type transistor TN6 may preferably be set to a sufficient high resistance value so as to avoid an excessive increase in detection current ID upon the conduction detection.

The input/output device 10B according to the third embodiment determines upon conduction detection whether the detection current ID flows. Thus, the input/output device 10B can be obtained which can reduce an influence exerted on equipment connected to the outside by setting the ON resistances of the P-type transistor TP3 and the N-type transistor TN6 to the sufficient high resistance value.

While the input signals PI1 through PI3 are compared with the threshold value REF by the A/D converter ADC and the digital comparator DC in the present embodiment, the third embodiment may take such a configuration that an analog comparator is used in place of the A/D converter ADC and the digital comparator DC to thereby input the input signals PI1 through PI3 to their corresponding comparison terminals and input a reference potential generated by proportional division of the source potential and the ground potential to its corresponding reference terminal. At this time, the reference potential becomes one equivalent to the threshold value REF. By doing so, the present embodiment can be constituted of a circuit simple as compared with the case in which the A/D converter ADC and the digital comparator DC are used.

Incidentally, the present invention is not limited to the above embodiments. It is needless to say that various improvements and modifications can be made within the scope not departing from the gist of the present invention.

While, for example, the conduction detector of the first embodiment is constituted of hardware using the conduction detection state machine, the present invention can be applied even to a case in which the portion of the conduction detection state machine is made up of software for controlling the CPU, and similar operations are performed. In such a case, it is needless to say that the present invention can be applied even where a decision signal is used as a flag and even where it is used as an interrupt signal.

While the conduction detection port controller is constituted of hardware using the state machine, the present invention can be applied even to a case in which the portion of the state machine is made up of software for controlling the CPU and similar operations are carried out.

Incidentally, the EOR gate 12 shows one example of the comparator, the P-type transistor TP1 and N-type transistor TN1 show one example of a first output buffer, the P-type transistor TP2 and N-type transistor TN2 show one example of a second output buffer, the input buffer IB1 shows one example of a first input buffer, the input buffer IB2 shows one example of a second input buffer, 3.3V shows one example of a first amplitude, 1.2V shows one example of a second amplitude, the P-type transistors TP3 and TP5 show one example of a first switch, and the N-type transistors TN4 and TN6 show one example of a second switch, respectively.

With the application of the present invention, an input/output device can be provided which is capable of constituting input/output ports in a simple circuit configuration without impairing reliability even where logic levels opposite in polarity are outputted between input/output devices made conductive to the outside.

What is claimed is:

1. An input/output device comprising:
    one reference port selected from a port group which inputs and outputs signals;
    a target port selected from other than the reference port of the port group; and
    a conduction detector which detects that conduction is made between input/output terminals for the reference port and the target port;
    wherein the conduction detector includes a detection signal generator which outputs a signal for detection to the reference port, and a comparator which compares a logic level of the signal generated by the detection signal generator and a logic level of a signal inputted to each of the target port, and
    wherein the detection signal generator outputs logic levels different from each other, and the comparator performs comparisons between the logic levels.

2. The input/output device according to claim 1, wherein the reference port includes a first output buffer which sets a first amplitude to a logic output level upon a normal operation, and a second output buffer which outputs a second amplitude smaller than the first amplitude upon a conduction detecting operation,
    wherein the target port includes a first input buffer which sets the first amplitude to a logic input level upon the normal operation, and a second input buffer which sets the second amplitude to a logic input level upon the conduction detecting operation, and
    wherein the conduction detector includes a detection signal generator which outputs a signal for detection to the second output buffer, and a comparator which compares a logic level of the signal generated by the detection signal generator and a logic level of a signal inputted from the second input buffer.

3. The input/output device according to claim 1, wherein the reference port includes a first switch provided between a first potential and the input/output terminal and made conductive upon a detecting operation,
    wherein the target port includes a second switch provided between a second potential opposite in polarity to the first potential and the corresponding input/output terminal and brought into conduction upon the detecting operation, and
    wherein the conduction detector includes a threshold voltage comparator which compares a voltage applied across the second switch with a predetermined threshold voltage.

4. The input/output device according to claim 3, wherein the comparator includes an A/D converter which detects the voltage applied across the second switch, and a digital comparator which compares a digital value outputted from the A/D converter with a digital value of the threshold voltage.

5. The input/output device according to claim 1, further comprising an output port controller which, when it is detected that the reference port and the target port are brought into conduction, supplies signals identical to each other to the input/output terminals for the reference port and the target port.

6. The input/output device according to claim 1, wherein the port controller includes a detection result register which stores detection results outputted from the conduction detector at addresses corresponding to the selections of the reference port and the target port, and a first port selector which switches the output of the corresponding target port to the same output as the output of the reference port when the contents stored in the detection result register indicate that conduction has been detected.

7. The input/output device according to claim 1, further comprising a conduction detection port controller which outputs selection control signal for selecting the reference port and the target port, and a second port selector which selects the reference port and the target port according to the selection control signal.

8. A method of controlling an input/output device, comprising;
    selecting one reference port from a port group which inputs and outputs signals;

selecting target port from other than the reference port of the port group; and detecting that conduction is made between the reference port and the target port, wherein the detecting include outputting a signal for detection to the reference port, and comparing a logic level inputted to the reference port and a logic level inputted to the target port, and wherein the outputting performs the output of signals having logic levels different from one another, and the comparing performs comparisons between the respective logic levels.

9. The method according to claim 8, further comprising supplying signals identical to each other to input/output terminals for the reference port and the target port when it is detected that the reference port and the target port are brought into conduction.

10. The method according to claim 8, further comprising outputting selection control signals for selecting the reference port and the target port, and selecting the reference port and the target port according to the selection control signals.

* * * * *